United States Patent
Shimoyama et al.

(10) Patent No.: US 6,639,926 B1
(45) Date of Patent: Oct. 28, 2003

(54) SEMICONDUCTOR LIGHT-EMITTING DEVICE

(75) Inventors: Kenji Shimoyama, Ushiku (JP); Satoru Nagao, Ushiku (JP); Katsushi Fujii, Ushiku (JP); Hideki Goto, Ushiku (JP)

(73) Assignee: Mitsubishi Chemical Corporation, Tokyo (JP)

( * ) Notice: Subject to any disclaimer, the term of this patent is extended or adjusted under 35 U.S.C. 154(b) by 0 days.

(21) Appl. No.: 09/274,767

(22) Filed: Mar. 24, 1999

(30) Foreign Application Priority Data

Mar. 25, 1998 (JP) ............................................ 98-77181

(51) Int. Cl.$^7$ ................................................ H01S 5/00
(52) U.S. Cl. ........................................ 372/46; 372/45
(58) Field of Search ........................................ 372/45, 46

(56) References Cited

U.S. PATENT DOCUMENTS

| 4,622,673 A | * | 11/1986 | Tsang ........................... 372/45 |
| 5,003,549 A | * | 3/1991 | Mitsui et al. ................... 372/46 |
| 5,465,266 A | | 11/1995 | Bour et al. ..................... 372/46 |

FOREIGN PATENT DOCUMENTS

| EP | 0 469 301 | 6/1990 |
| EP | 0 867 949 | 9/1998 |

OTHER PUBLICATIONS

Lin J–F et al: "High temperature and low threshold current operation of strained Al GaInP/Ga0.4In0.6P multiple quantum well laser diodes emitting at 676 nm" vol. 30, No. 6, pp. 494–495. (Mar. 1994).

Patent Abstracts of Japan; vol. 017, No. 065 (E–1317); Feb. 9, 1993 & JP 04 269886 A (Toshiba Corp.), Sep. 25, 1992.

Patent Abstracts of Japan; vol. 1997, No. 11, Nov. 28, 1997 & JP 09 199791 A (NNEC Corp), Jul. 31, 1997.

* cited by examiner

*Primary Examiner*—Quyen Leung
(74) *Attorney, Agent, or Firm*—Armstrong, Westerman & Hattori, LLP (57) ABSTRACT

A semiconductor light-emitting device comprising a substrate having a surface having an off-angle to a crystallographic plane of low-degree surface orientation, the substrate having thereon: compound semiconductor layers including an active layer; a selective growth protective film formed on the compound semiconductor layers and having an opening at the region corresponding to a stripe region to which a current is injected; and a ridge-shaped compound semiconductor layer formed to cover the opening. This semiconductor light-emitting device with stable laser property can be manufactured in a simplified way.

25 Claims, 3 Drawing Sheets

SEMICONDUCTOR LIGHT-EMITTING DEVICE

FIELD OF THE INVENTION

This invention relates to a semiconductor light-emitting device and, more particularly, to a semiconductor light-emitting device having a ridge waveguide type stripe structure, which is suitable for a semiconductor laser device, and a manufacturing method for this semiconductor light-emitting device.

DESCRIPTION OF THE RELATED ART

Figure 2A:
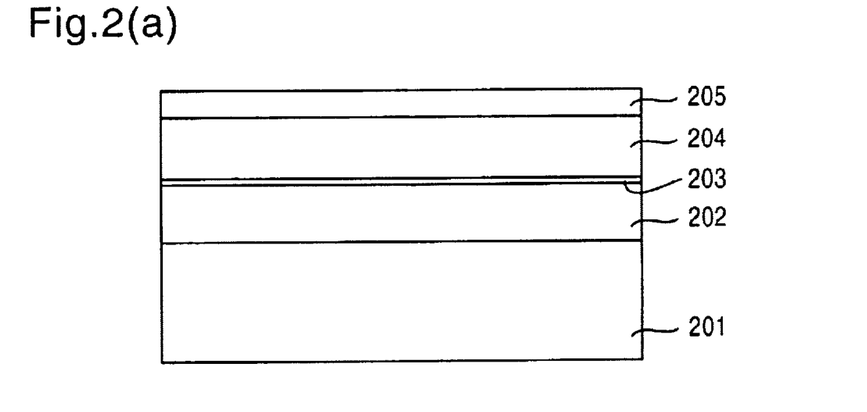
FIG. 2(a) to FIG. 2(c) are cross-sectional views illustrating a conventional semiconductor light-emitting device in which a ridge portion is formed by etching process and a manufacturing method for this semiconductor light-emitting device.
Figure 2B:
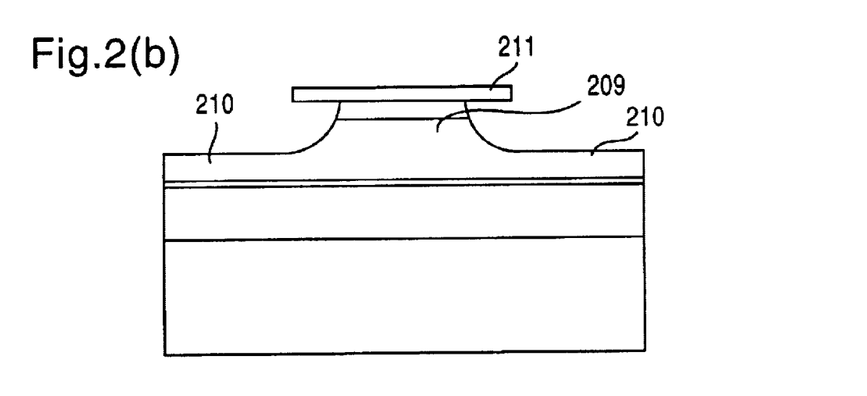
Figure 2C:
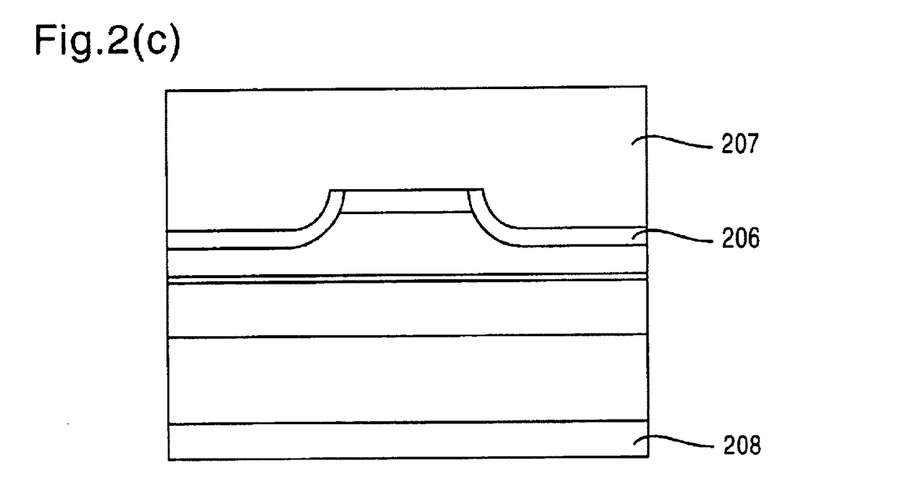

A structure so-called as a ridge waveguide type is frequently used to produce semiconductor light-emitting devices without difficulties. FIG. 2 shows a manufacturing method for such a structure. First, a first conductivity type cladding layer 202, an active layer 203, a second conductivity type cladding layer 204, and a second conductivity type contact layer 205 are grown on a substrate 201. A photoresist 211 having stripe openings as a pattern made by photolithography is formed on a wafer surface to form a stripe-shaped ridge 209 by a wet etching process using the photoresist 211 as a mask so that the second conductivity type cladding layer remains with a prescribed thickness. An insulating protective film 206 such as SiNx is subsequently formed on the whole surface on an epitaxial side, and only the protective film at the top of the ridge is removed by etching using a photoresist having stripe openings as a pattern made by photolithography. This structure prevents a current from flowing through portions other than the top of the ridge. Another layer of protective film may further be formed on the ridge side surface. Then, an epitaxial side electrode 207 and a substrate side electrode 208 are formed.

According to this structure, currents are injected into the active layer 203 after injected through the ridge portion 209 of the cladding layer. Currents are thus concentrated into the active layer region under the ridge portion 209, thereby generating light having a wavelength corresponding to the band gap of the active layer. At that time, the band gap of the active layer is ordinarily smaller than those of the upper and lower cladding layers, and the refractive index of the active layer is larger than those of the upper and lower cladding layers, so that carriers and light can be confined effectively in the active layer. Because the protective film 206 having a smaller refractive index than the semiconductor portions is formed at a non-ridge portion 210, the effective refractive index of the active layer region under the non-ridge portion 210 becomes smaller than that of the ridge portion 209. Consequently, the generated light is confined in the active layer region under the ridge portion 209. This structure thus can stabilize the transverse mode for laser oscillation and can reduce the threshold currents.

With such a conventional manufacturing method for ridge waveguide type semiconductor light-emitting device, the ridge portion is formed by the etching process, so that it is difficult to accurately control the thickness of the cladding layer at the non-ridge portion 210. As a result, the effective refractive index at that portion largely varies due to slight differences of the thickness of the cladding layer at the non-ridge portion, thereby deviating the laser characteristics of the semiconductor light-emitting device, and rendering product yields hardly improve. Where a laser device of a single transverse mode is produced, a very highly accurate alignment technique is required, because it is difficult to use process simplifying techniques such as a self-alignment in the conventional manufacturing method, though the top width of the ridge portion is at most about several microns. Such a complicated, fine photolithographic technology makes device production steps complicated and device production yields reduced. If a SiNx film is formed on the ridge side wall, a deletion layer of about 0.1 micron may be formed on the surface side of the ridge side wall to narrow the effective current channel width, thereby raising a problem that the pass resistance becomes larger.

Meanwhile, as a light source for information processing to improve the recording density, visible laser devices (ordinarily 630 to 690 nm) using AlGaInP basis in lieu of conventional AlGaAs basis (wavelength about 780 nm) are put to practical use, but the following researches have been made to realize shorter wavelength, lower threshold, and high temperature operation.

In a production of an AlGaInP/GaInP based visible laser device, use of a substrate having an off-angle from the (100) plane toward the [011] direction (or [0-1-1] direction) allows the band gap from narrowing due to formation (ordering) of natural super lattices, thereby rendering the wavelength shorter readily, facilitating high concentration doping of p-type dopants (e.g., Zn, Be, and Mg), and improving the oscillation threshold current of the device by enhancement of the hetero-barrier and temperature characteristics. If the off-angle is too small, step bunching appears outstandingly, and large undulations are formed at the hetero-boundaries, so that a shift amount in which the PL wavelength (or oscillation wavelength) is shortened by quantum effects to the bulk active layer may be smaller than the designed amount where a quantum well structure (GaInP well layer of about 10 nm or less) is manufactured. If the off-angle is made larger, the step bunching is reduced, and the hetero-boundaries become flat, thereby making the wavelength shorter by the quantum effect as designed. Thus, a substrate having an off-angle of 6 to 16 degrees from the (100) plane toward the [011] direction (or [0-1-1] direction) is generally used to suppress formation of natural super lattices and generation of step bunching, which impede the wavelength from becoming shorter, as well as to suppress the oscillation threshold current from increasing due to shortened wavelength from p-type high concentration doping and impairment of temperature characteristics. A proper off-angle should be selected in consideration of thickness of the GaInP well layer and the stress amount depending on the targeted wavelength such as 650 nm or 635 nm.

When natural super lattice is formed in the active layer, it is deformed to be mixed crystal during current injection whereby problems may be raised such that oscillation wavelength or emission wavelength is changed and device properties are impaired. Natural super lattice is easily formed in an active layer made of materials including In and Ga as constituent elements such as GaInAs, AlGaInAs, InGaAsP as well as the above-mentioned GaInP and AlGaInP. Use of an off-angle substrate suppresses formation of natural super lattice and effectively solves the problems.

Figure 3A:
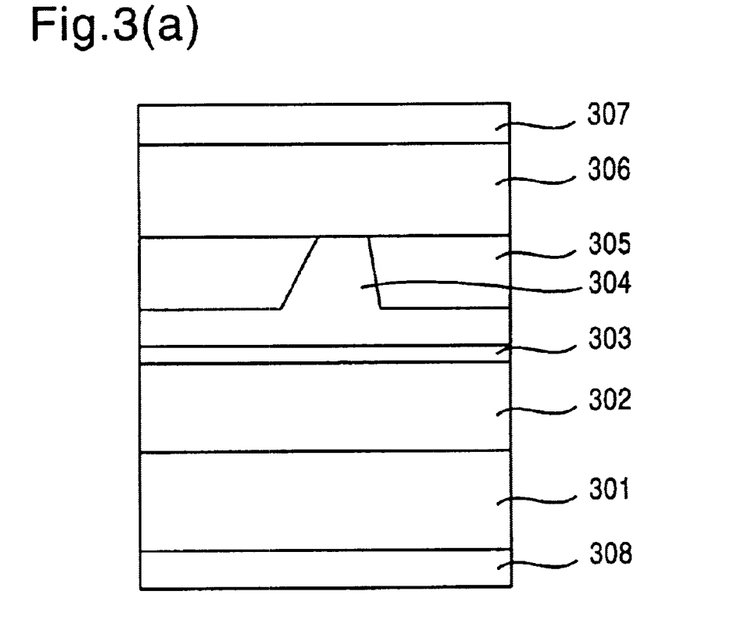
FIG. 3(a) and FIG. 3(b) are cross-sectional views illustrating a conventional semiconductor light-emitting device having a ridge type or groove type inner stripe structure in which a current block layer made of semiconductor is used, and a manufacturing method for this semiconductor light-emitting device.
Figure 3B:
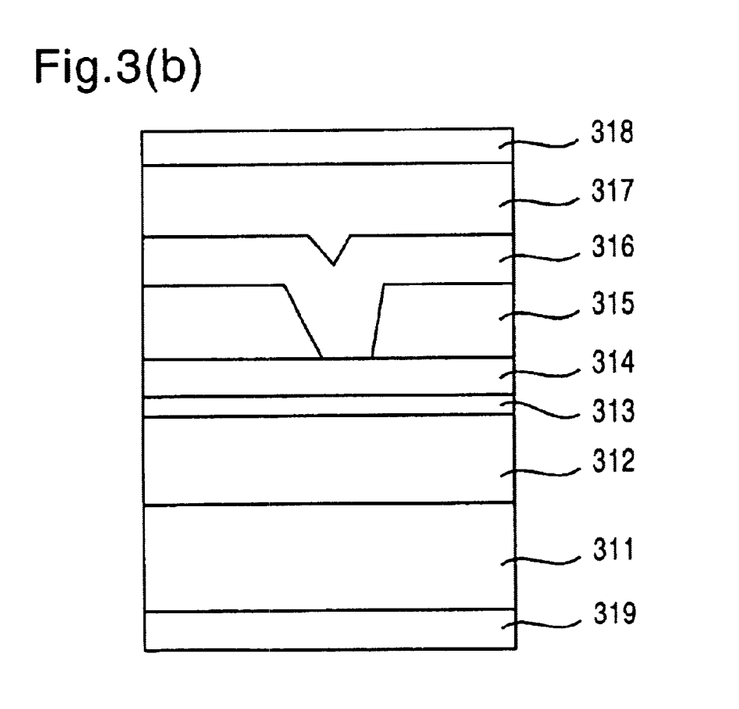

To reduce waveguide loss and mirror loss, a resonator is formed in extending in a striped shape as much as vertical to the off-angled direction of the substrate. FIGS. 3(a) and 3(b) show cross sections of conventional ridge and groove type inner stripe structures made of a semiconductor using a current block layer. In FIGS. 3(a), 3(b), numeral 301 is a substrate; numeral 302 is a first conductivity type cladding layer; numeral 303 is an active layer; numeral 304 is a second conductivity type cladding layer; numeral 305 is a first conductivity type current block layer; numeral 306 is a second conductivity type contact layer; numeral 307 is an epitaxial side electrode; numeral 308 is a substrate side electrode; numeral 311 is a substrate; numeral 312 is a first conductivity type cladding layer; numeral 313 is an active layer; numeral 314 is a second conductivity type first cladding layer; numeral 315 is a first conductivity type current block layer; numeral 316 is a second conductivity type second cladding layer; numeral 317 is a second conductivity type contact layer; numeral 318 is an epitaxial side electrode; and numeral 319 is a substrate side electrode. In this situation, because the shape of the ridge or groove may become horizontally asymmetric or the optical density profile may become horizontally asymmetric due to the off-angle of the substrate, problems may be raised such that a stable fundamental transverse mode required for a laser diode for information processing such as for optical discs may not be easily obtained, that kink level may be lowered, and that the horizontal asymmetry of the beam profile may increase. Particularly, in the case of real refractive index guide in which ends of the optical profile come out to the block layer, this problem may become apparent.

In consideration of those problems in the conventional art, it is an object of the invention to provide a semiconductor light-emitting device having a ridge waveguide type stripe structure which can be manufactured in a simple way with stable laser property. It is also another object of the invention to provide a semiconductor light-emitting device having a stable fundamental transverse mode at a high power operation stage where the horizontal symmetry of the ridge shape of the ridge waveguide type laser is almost not affected by the horizontal asymmetry of the optical intensity profile even where a substrate having a large off-angle for shortening the wavelength as for the AlGaInP/GaInP based visible laser diode is used. It is yet another object of the invention to provide a method for manufacturing semiconductor light-emitting device with good production yield in a simplified step for producing such a device without requiring any complicated, fine photolithographic technology.

SUMMARY OF THE INVENTION

The inventors have discovered, upon extensive researches to accomplish the above objects, that covering both sides of a stripe region with a protective film makes a complicated, fine photolithographic technology unnecessary, simplifies a manufacturing process for the device, and greatly improves production yield of the device. The inventors also found that the semiconductor light-emitting device having such a structure can be manufactured easily by a selective growth using the protective film, and reached the invention upon finding that a semiconductor light-emitting device can obtain a stable fundamental transverse mode at a high power operation stage where the horizontal symmetry of the ridge shape of the ridge waveguide type laser is almost not affected by the horizontal asymmetry of the optical intensity profile even where a substrate having a large off-angle for shortening the wavelength as for the AlGaIn/GaInP based visible laser diode is used.

That is, this invention is to provide a semiconductor light-emitting device comprising a substrate having a surface having an off-angle to a crystallographic plane of low-degree surface orientation, the substrate having thereon: compound semiconductor layers including an active layer; a selective growth protective film formed on the compound semiconductor layers and having an opening at the region corresponding to a stripe region to which a current is injected; and a ridge-shaped compound semiconductor layer formed to cover the opening.

In another aspect of the invention, a semiconductor light-emitting device comprises a substrate having a surface having an off-angle to a crystallographic plane of low-degree surface orientation, the substrate having thereon: compound semiconductor layers including an active layer; a protective film formed on the compound semiconductor layers and having an opening at the region corresponding to a stripe region to which a current is injected; and a ridge-shaped compound semiconductor layer formed to cover the opening, wherein at least a portion of a side wall of the ridge-shaped compound semiconductor layer has a forward mesa shape.

In the semiconductor light-emitting device according to the invention, preferably, the compound semiconductor layers includes an active layer further include a first conductivity type cladding layer and a second conductivity type first cladding layer, and ridge-shaped compound semiconductor layer includes a second conductivity type second cladding layer. No protective film is preferably formed either on a top portion or side surfaces of the ridge-shaped compound semiconductor layer, and a contact layer may be formed as to cover the entire surface of the top portion and the side surfaces of the ridge-shaped compound semiconductor layer. The ridge-shaped compound semiconductor layer is preferably formed as to cover a portion of the surface of the protective film. The crystallographic plane of the low-degree surface orientation of the substrate may be a (100) plane or a plane crystallographically equivalent to a (100) plane; the off-angle may be 30 degrees or less; and a direction of the off-angle is preferably within ±30° from a direction perpendicular to a longitudinal direction of the stripe region. A longitudinal direction of the stripe region may be within ±30° from a [0-11] direction or a direction crystallographically equivalent to a [0-11] direction, and the off-angle direction may be preferably within ±30° from a [0-11] direction or a direction crystallographically equivalent to a [0-11] direction. The active layer is preferably, an AlGaInP layer or a GaInP layer, and the substrate is preferably made of a zinc-blende type crystal such as GaAs. An oxidation suppressing layer may be preferably provided between the protective film and the compound semiconductor layers including an active layer so that the oxidation suppressive layer covers the semiconductor layers including an active layer at the opening of the protective layer.

In yet another aspect of the invention, a method of manufacturing semiconductor light-emitting device comprises the steps of: growing a compound semiconductor epitaxial layer including an active layer on a substrate having a surface having an off-angle to a crystallographic plane of low-degree surface orientation; forming a protective film having an opening on a surface of the compound semiconductor epitaxial layer; and selectively growing a ridge-shaped compound semiconductor epitaxial layer to cover the opening.

In the method of manufacturing semiconductor light-emitting device according to the invention, preferably, the compound semiconductor layers includes an active layer further including a first conductivity type cladding layer and a second conductivity type first cladding layer, and ridge-shaped compound semiconductor layer includes a second conductivity type second cladding layer. The second conductivity type second cladding layer is preferably grown as to cover a portion of a surface of the protective film.

DETAILED DESCRIPTION OF THE INVENTION

Hereinafter, in regard with the semiconductor light-emitting device of the invention, details of respective layers and an example of a manufacturing process are described specifically.

The semiconductor light-emitting device of the invention at least includes on a substrate compound semiconductor layers including an active layer, a protective film formed on the compound semiconductor layers and having an opening at the region corresponding to a stripe region to which a current is injected, and a ridge-shaped compound semiconductor layer formed to cover the opening.

On a substrate, a buffer layer can be formed. The first conductivity type cladding layer may have a double layer structure made of a first conductivity type first cladding layer and a first conductivity type second cladding layer. The cladding layers sandwiching the active layer have a smaller refractive index than that of the active layer. A compound semiconductor made of those cladding layers and active layer may include a layer functioning as an optical guide layer.

The protective film having an opening is formed on the second conductivity type first cladding layer. An oxidation suppressive layer may be formed between the second conductivity type first cladding layer and the protective film. A stripe region is defined by the opening in the protective film, and a ridge type compound semiconductor layer having a smaller refractive index than that of the active layer is formed on the stripe region. A major portion of the compound semiconductor layer is ordinarily made of a second conductivity type second cladding layer. The compound semiconductor layer may include a layer functioning, e.g., an optical guide layer in addition to the second conductivity type second cladding layer. A low resistance contact layer may preferably cover substantially the whole surfaces of the top and the side surfaces of the ridge.

The substrate used for the semiconductor light-emitting device according to the invention is not specifically limited as far as allowing a double heterostructure crystal to grow on the substrate. What is preferable is a conductive material, and desirably, the substrate is a crystal substrate made of, e.g., GaAs, InP, GaP, ZnSe, ZnO, Si, and $Al_2O_3$ suitable for growth of a crystal thin film on the substrate, more preferably, a crystal substrate having a zinc-blende structure. The crystal growth surface on the substrate is a plane with a low degree orientation or its crystallographically equivalent plane, more preferably a (100) plane and its crystallographically equivalent planes such as (100) plane and (111) plane.

In this specification, "(100) plane" is not necessary to be strictly just a (100) plane and can encompass cases that the substrate has an off-angle of 30° at most. In regard with the scale of the off-angle, the upper limit is preferably 30° or less, more preferably 16° or less, whereas the lower limit is preferably 0.5° or greater, more preferably 2° or greater, further preferably 7° or greater, and most preferably 10° or greater. The direction of the off-angle is preferably within ±30° from a direction perpendicular to a longitudinal direction of the stripe region, more preferably, within ±7°, and most preferably, within ±2°. The direction of the stripe region is preferably, a [0-11] direction or a direction crystallographically equivalent to a [0-11] direction in the case where the crystallographical plane of the substrate is (100), and the off-angle direction is preferably within ±30° from a [0-11] direction or a direction crystallographically equivalent to a [0-11] direction. The substrate may be a hexagonal system substrate such as wurtzite structure substrate, and in such a case, $Al_2O_3$, 6H—SiC, etc. can be used.

The material and structure of the cladding layer, the active layer, and the contact layer are not specifically limited. It is preferable to use a general group III–V or II–VI semiconductor such as AlGaAs, AlGaInAs, AlGaInP, GaInAsP, AlGaInN, BeMgZnSe, MgZnSSe, and CdZnSeTe. As a cladding layer, a material having a smaller refractive index than that of the active layer is selected, and as a contact layer, a material having a narrower band gap than that of the cladding layer is selected. As a proper carrier density of a low resistance to gain an ohmic contact with electrodes, the lower limit is preferably $1\times10^{10}$ $cm^{-3}$ or greater, more preferably, $3\times10^{18}$ $cm^{-3}$ or greater, most preferably, $5\times10^{18}$ $cm^{-3}$ or greater. The upper limit is preferably $2\times10^{20}$ $cm^{-3}$ or less, more preferably, $5\times10^{18}$ $cm^{-3}$ or less, most preferably, $3\times10^{19}$ $cm^{-3}$ or less.

The active layer is preferably made of compound semiconductor materials including In and Ga as constituent elements such as GaInP, AlGaInP, GaInAs, AlGaInAs, InGaAsP. An off-angle substrate could effectively suppress formation of natural super lattice, which easily occurs to these active layer materials.

The active layer is not limited to a single layer and can be a single quantum well structure (SQW) composed of a quantum well layer and optical guide layers vertically sandwiching the quantum well layer or a multiple quantum well structure (MQW) composed of plural quantum well layers, barrier layers sandwiched between the quantum well layers, and optical guide layers respectively formed on the uppermost quantum well layer and under the lowermost quantum well layer.

With the semiconductor light-emitting device of the invention, an oxidation suppressive layer can be formed on the compound semiconductor layer. The oxidation suppressive layer can easily prevent a high resistance layer, which increases passing resistance on a re-growth boundary where the clad is formed in a ridge shape by re-growth, from occurring.

For this purpose, the oxidation suppressive layer should be formed between the compound semiconductor layer including an active layer and the protective film mentioned below. As a result, the oxidation suppressive layer covers the surface of the compound semiconductor layer including an active layer at the opening of the protective film.

As the oxidation suppressive layer, there is no special limitation on selection of the material as far as it is hardly oxidized or it is cleaned up easily. More specifically, a compound semiconductor layer of III–V group having a low containing rate of readily oxidized elements such as Al (about 0.3 or less) is exemplified. It is preferable that the oxidation suppressive layer does not absorb light from the active layer by selecting the material or thickness of the oxidation suppressive layer. The material of the oxidation suppressive layer can be ordinarily selected from materials having a wider band gap than that of the active layer, but a material, even where its band gap is narrow, can be used where the thickness is 50 nm or less, preferably, 30 nm or less, more preferably, 10 nm or less because light absorbing can be substantially neglected.

The protective film used in the semiconductor light-emitting device of the invention is also not particularly limited, but it is necessary to perform current injections only to a region of the active layer located below the ridge portion, which is formed as a stripe region. That is, to confine currents by the protective film on both sides of the stripe shaped opening, the protective film has to be insulation. The refractive index of the protective film is preferably smaller than that of the ridge-shaped semiconductor layer, namely the second conductivity type second cladding layer, to give effective refractive index difference between the ridge portion and the non-ridge portion in a horizontal direction in the active layer and to stabilize the transverse mode of the laser oscillation. However, as a practical matter, if the refractive index difference is too large between the protective film and the cladding layer, the second conductivity type first cladding layer below the ridge has to be thicker because the effective refractive index step in the transverse direction tends to be larger in the active layer, thereby increasing leak currents in the transverse direction. To the contrary, if the refractive index difference is too small between the protective film and the cladding layer, the protective film has to be formed thicker to some extent since the light easily leaks outside the protective film, but this tends to impair the cleavage property. In consideration of those, together, the lower limit of the refractive index difference between the protective film and the cladding layer is 0.2 or greater, more preferably, 0.3 or greater, and most preferably, 0.5 or greater. The upper limit is 3.0 or less, more preferably, 2.5 or less, and most preferably, 1.8 or less. There would be no problem, in regard with the thickness of the protective film, as far as the protective film can show a sufficient insulation property and has a thickness such that light does not come outside the protective film. The lower limit of the protective film is preferably 10 nm or greater, more preferably, 30 nm or greater, and most preferably, 50 nm or greater. The upper limit is preferably 500 nm or less, more preferably, 300 nm or less, and most preferably, 200 nm or less.

The protective film is preferably a dielectric, and more specifically, can be selected preferably from a group of $SiN_x$ film, $SiO_2$ film, SiON film, $Al_2O_3$ film, ZnO film, SiC film, and amorphous Si film. Particularly, $SiN_x$ film, $SiO_2$ film, and $Al_2O_3$ film are preferable since suitable for the selective growth at the ridge portion. The protective film is used as a mask for formation of the ridge portion through a re-growth using MOCVD and is also used for the purpose of current squeezing. For simplifying the process, it is preferable to use a film having the same composition commonly for current squeezing and for selective growth, but layers having different compositions may be formed as a multilayer when necessay.

In the case where the substrate has a zinc blende structure and the surface of the substrate is the (100) plane or a plane which is crystallographically equivalent to the (100) plane, in order to cause the second conductivity type second cladding layer to be easily grown on the protective film and the contact layer (which is described later) to be easily grown on the side surfaces of the ridge (the second conductivity type second cladding layer), a stripe region which is defined by an opening of the protective film preferably elongates in the [01-1]B direction or a direction which is crystallographically equivalent to the direction. In this case, it is often that most of the side surfaces of the ridge are configured by the {311}A planes such as (311)A plane and (3-1-1)A plane, and it is possible to grow the contact layer on a substantially whole area of the growing surface of the second conductivity type second cladding layer which constitutes the ridge. For the same reason, in the case where the substrate has wurtzite sutrcture, a stripe region preferably elongates in a [11-20] or [1-100] direction on a (0001) surface, for example. When the epitaxial layers are grown by HVPE (Hydride Vapor Phase Epitaxy), both [11-20] and [1-100] provide the same result. When the epitaxial growth method is MOCVD, [11-20] is preferable. This tendency is particularly noticeable when the second conductivity type second cladding layer is made of AlGaAs, particularly, having an Al composition of 0.2 to 0.9, preferably, 0.3 to 0.7. In the specification, the term "[01-1]B direction" defines the [01-1]B direction so that, in a usual group III–V or II–VI semiconductor, the (11-1) plane existing between the (100) plane and the (01-1) plane is a plane in which the element of group V or VI appears. Furthermore, the term is not limited to a direction which is strictly just as the [01-1]B direction and includes directions which are deviated from the [01-1]B direction by about ±10°. The embodiment of the invention is not limited to the case where the stripe region elongates in the [01-1]B direction. Hereinafter, other embodiments are described.

In the MOCVD, for example, the growth conditions are suitably selected, i.e., when the stripe region which is defined by the opening of the protective film is set to elongate in the [011]A direction, the growth rate can be provided with anisotropy. Namely, the growth rate can be set so that the growth is rapid in the (100) plane and is hardly conducted in the {111}B planes such as (1-11)B plane and (11-1)B plane. When selective growth is performed in the (100) plane of the stripe-like window under such anisotropic conditions, a ridge in which a side face is the {111}B planes such as (1-11)B plane and (11-1)B plane is formed. In this case, when conditions of the MOCVD are selected so that growth of higher isotropy occurs, the contact layer can be formed on the top of the ridge which is the (100) plane, and also on the ridge side face composed of the {111}B planes such as (1-11) B plane and (11-1)B plane.

The method of producing the semiconductor light-emitting device of the first aspect of the invention is not particularly limited. Generally, the double heterostructure is formed on the substrate, and the second conductivity type second cladding layer and the contact layer which constituted a ridge shape are then selectively grown, by using the protective film on the stripe region into which a current is injected. At this time, in order to enable a part of the second conductivity type second cladding layer to be formed on the protective film, conditions are set in which the second conductivity type second cladding layer easily grows in a direction vertical to the direction along which the stripe region elongates within the substrate surface plane, or, in other words, a condition where a lateral growth suitably occurs. Specifically, when the surface of the substrate is the (100) plane, the direction along which the stripe region defined by the opening of the protective film is set to be the [01-1]B direction, and the temperature, the supply amount of the source material, and the like are appropriately adjusted. When the second conductivity type second cladding layer is made of a III–V compound semiconductor, a lateral growth occurs more easily as the temperature is lower and the V/III ratio is larger. When a composition containing Al is used, a lateral growth occurs more easily as the Al content is higher.

Figure 1A:
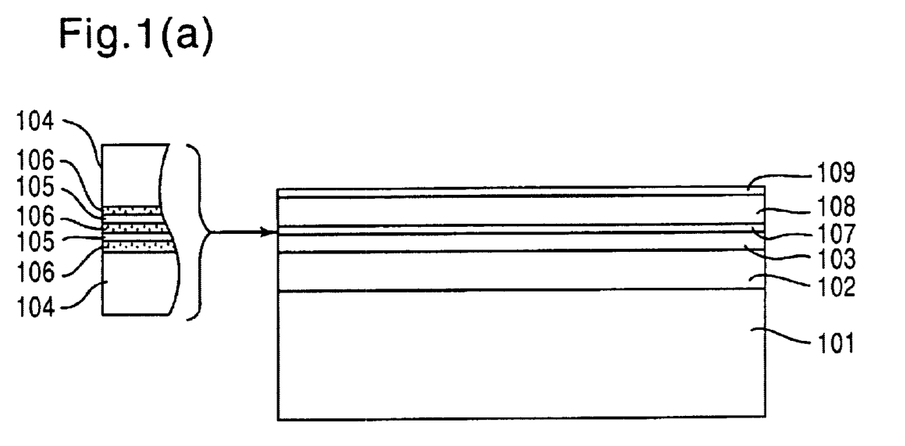
FIG. 1(a) to FIG. 1(c) are cross-sectional views illustrating a semiconductor light-emitting device according to the invention and a manufacturing method for this semiconductor light-emitting device.
Figure 1B:
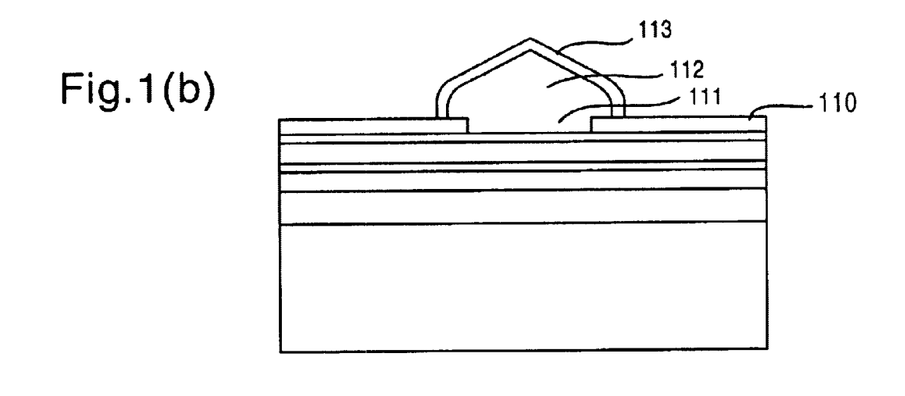

As shown in FIG. 1(b), the protective film is in contact with the second conductivity type cladding layer only on the side surfaces and the top surface which defines the stripe region, and it is preferable that no protective film is formed on the top and sides of the ridge type second conductivity type second cladding layer. Such a structure is preferable because the device can be manufactured easily and because the characteristics in the passing resistance or the like are improved. The width of the stripe region is set preferably to 2.2 to 1000 microns. With the width in this range, the laser can realize a high power operation.

The height (thickness) of the second conductivity type second cladding layer is preferably set to 0.25 to 2.0 times of the stripe region width. If within this range, it is preferable because the second conductivity type second cladding layer would not be projected so much in comparison with the current block layer or ridge dummy layer as described below, because the device life would not be affected due to stresses exerted to the ridge portion when the device is used in a manner of the junction down, and because post processes such as a forming process for electrodes are done easily since it is very low in comparison with its vicinity.

A contact layer is preferably formed on the top and/or sides of the ridge of the second conductivity type second cladding layer. A preferable configuration is to form the contact layer on the whole surface of the top and sides of the ridge. By holding a sufficient contact area between the contact layer and an electrode formed on the contact layer or the second conductivity type second cladding layer, the resistance of the entire apparatus can be maintained at a low level. A portion of the top and sides of the ridge on which the contact layer is formed can also be covered with a protective film for the purpose of prevention of oxidation. In this embodiment, the resistance of the entire apparatus can be suppressed to be smaller than that of the apparatus in which a protective film is formed on ridge side surfaces without forming any contact layer. Particularly, with respect to a material having a high specific resistance (especially, p-type) such as AlGaInP basis or AlGaInN basis, it is effective to reduce the resistance of the entire device.

When the semiconductor light-emitting device of the invention is manufactured, methods conventionally used can be selected properly. The method for growing the crystal is not specifically limited, and for the crystal growth of the double hetero-structure or for selective growth of the ridge portion, known growing methods such as metal organic chemical vapor deposition (MOCVD), molecular beam epitaxy (MBE method), hydride or hallide vapor phase epitaxy (VPE method), and liquid phase epitaxy (LPE method) can be used upon proper selection.

The semiconductor light-emitting device according to the invention can be manufactured by the steps of: growing an epitaxial layer including a first conductivity type cladding layer, an active layer, and a second conductivity type first cladding layer on a substrate having a major surface having an off-angle to a low degree crystallographic plane; forming a protective film having an opening on a surface of the epitaxial layer; and selectively growing a second conductivity type second cladding layer at the opening. It is preferable to form electrodes on the top and sides of the ridge without forming any protective film on the ridge side surface. The specific conditions for growing the respective layer may vary depending on the layer's composition, growing method, shape of the apparatus, etc., and in a case that a compound semiconductor of group III–V is grown by the MOCVD, preferably, the double hetero-structure is formed at a growing temperature of about 650 to 750° C. with a V/III ratio of about 20 to 60 (in the case of AlGaAs) or about 350 to 550 (in the case of AlGaInP), whereas the ridge portion is formed at a growing temperature of 600 to 700° C. with V/III ratio of about 40 to 60 (in the case of AlGaAs) or about 350 to 550 (in the case of AlGaInP).

Where the ridge portion selectively grown in use of the protective film contains, particularly, Al such as in AlGaAs and AlGaInP, it is very preferable if a very small amount of an HCl gas is introduced during the growth, because the gas prevents polycrystals from depositing. However, as the Al is contained much more in the composition, or as the ratio of the mask portion to the opening is higher, a necessary introduction amount of HCl increases for making a selective growth only on the opening (selective mode) in preventing polycrystals from depositing where other growing conditions are unchanged. On the other hand, if the HCl gas is introduced too much, the AlGaAs layer may not be grown, and conversely, although the semiconductor layer is etched (etching mode), a necessary introduction amount of HCl increases for entering to the etching mode as the Al is contained much more in the composition, even where other growing conditions are unchanged. The optimum introduction amount of HCl greatly depends on a molecular number of the group III source supply including Al such as trimethylaluminum or the like. More specifically, the ratio of the supply molecular number of HCl to group III source supply molecular number including Al (HCl/Group III) is equal to or greater than 0.01 and equal to or less than 50, more preferably, equal to or greater than 0.05 and equal to or less than 10, and most preferably, equal to or greater than 0.1 and equal to or less than 5. It is to be noted that the ridge composition may not be controlled easily where a chemical compound including In in the ridge is selectively grown (particularly, HCl introduced).

The second conductivity type second cladding layer is preferably grown as to cover the top surface of the protective film serving as an insulator to properly control the light profile otherwise coming out the vicinity of the protective film and the ridge. A contact layer may be grown on substantially the entire surface on which crystals can be grown on the second conductivity type second cladding layer, thereby suppressing the side of the cladding layer from oxidizing, increasing the contact area with the electrode on the epitaxial surface side to reduce the contact resistance with the electrode. Growth of the cladding layer of the re-growth portion and the contact layer as to cover the top of the insulation film can be done individually or in a combination of those.

Furthermore, where the ridge is formed by re-growth, a ridge dummy layer, to which a current is not injected, having a larger area than the ridge portion into which a current is injected can be formed to improve the controllability of the composition of ridge portion, the carrier concentration, and the growth rate. In this situation, an insulation covering layer such as an oxide layer or a thyristor structure is formed at a portion of the ridge dummy layer to prevent the current from passing. Where the current injection stripes are formed on the off-angled substrate in a perpendicular direction as much as possible to the off direction, although the ridge of the re-growth becomes horizontally asymmetric, the light profile that comes out the vicinity of the protective film and the ridge has a good symmetry, because the refractive index difference between the protective film and the cladding layer of the ridge portion is easily made larger than the conventional block layer made of a semiconductor layer as shown in FIG. 2, and because the cladding layer of the re-growth portion can be grown as to cover the top surface of the protective film by selecting the stripe direction properly, and therefore, this device can obtain a fundamental transverse mode oscillation which is stable even at a high output stage. Thus, this invention is applicable to various ridge stripe type waveguide structure semiconductor light-emitting devices.

As the optimum figure to which this invention is applied, a protective film made of an insulator is formed on a substrate having an off-angle to the low degree crystallographic plane; where an oxidation suppressive layer is formed on the epitaxial surface side of the double heterostructure, a cladding layer in the ridge shape and a contact layer on the cladding layer is re-grown at the stripe region to which a current is injected as to cover the top of the protective film made of an insulator; in this situation, a ridge dummy layer to which no current is injected is formed having a larger area than the ridge portion; the electrodes are formed on the top and sides of the ridge where no protective film made of an insulator is formed on the ridge side surface.

A laser chip cut out by cleavage from the wafer to which the electrodes are attached is sealed in a CAN package in a nitrogen atmosphere ordinarily together with a heat sink and a photodiode for optical output monitoring and is assembled. Recently, the laser chip may be assembled as an integrated optical circuit unifying other optical parts for rendering the device smaller and further inexpensive. This invention can serve for wide uses including this.

In the above, light sources for information processing (ordinarily AlGaAs basis, wavelength about 780 nm; AlGaInP basis, wavelength about 600 nm; and InGaN basis, wavelength about 400 nm) are described as examples of semiconductor laser devices utilizing the present invention. It should be understood that the present invention can be applied to a wide variety of devices such as a light source for communication signal laser (ordinarily InGaAsP or InGaAs based active layer, wavelength about 1.3 $\mu$m, 1.5 $\mu$m), a light source for exciting fiber laser (InGaAs stressed quantum well active layer and GaAs based substrate, wavelength about 980 nm; InGaAsP stressed quantum well active layer and InP based substrate, wavelength about 1480 nm), particularly devices of a high power operation. The present invention can be applied to light-emitting diode as well as semiconductor laser.

Hereinafter, an example is described to illustrate the invention in detail. The material, concentration, thickness, manipulation order, and the like are properly changeable as far as not goes beyond the spirit of the invention. Accordingly, the scope of the invention is not limited to the details shown in the following example.

EXAMPLE

This example is shown in FIG. 1. On a GaAs substrate 101 having a thickness of 350 microns and an off-angle of about 10° to 15° in a [0-1-1]A direction from (100) plane, first, a Si doped n-type GaAs buffer layer (n=1×10$^{18}$ cm$^{-3}$), not shown, having a thickness of 0.5 micron, a Si doped Al$_{0.75}$Ga$_{0.25}$As cladding layer 102 (n=1×10$^{18}$ cm$^{-3}$) having a thickness of 1.5 microns, a Si doped n-type (Al$_{0.7}$Ga$_{0.3}$)$_{0.5}$In$_{0.5}$P cladding layer 103 (n=1×10$^{18}$ cm$^{-3}$) having a thickness of 0.2 micron, a multiple quantum well (MQW) active layer 107 made of non-doped Ga$_{0.44}$In$_{0.56}$P well layer 106 (four layers) having a thickness of 5 to 6 nm sandwiched by non-doped (Al$_{0.7}$Ga$_{0.3}$)$_{0.5}$In$_{0.5}$P optical guide layers 104 having a thickness of 30 nm or non-doped (Al$_{0.7}$Ga$_{0.3}$)$_{0.5}$In$_{0.5}$P barrier layers 105 having a thickness of 5 nm, a Zn doped p-type (Al$_{0.7}$Ga$_{0.3}$)$_{0.5}$In$_{0.5}$P cladding layer 108 (p=7×10$^{17}$ cm$^{-3}$) having a thickness of 0.2 micron, a Zn doped p-type Ga$_{0.5}$In$_{0.5}$P oxidation suppressive layer 109 (p=1×10$^{18}$ cm$^{-3}$) having a thickness of 5 nm were accumulated orderly to form a double hetero-structure by MOCVD(FIG. 1(a)). At that time, the oxidation suppressive layer preferable has a selected composition so as not to absorb light generated by re-combinations in the active layer in order to reduce the threshold current, but can be used as an saturable absorbing layer upon absorbing light intentionally to do self-pulsation. It is further effective to change the composition of the Ga$_x$P oxidation suppressive layer with Ga rich side (X=0.5 to 1) or to add Al in a small amount ((Al$_x$Ga$_{1-x}$)$_{0.5}$In$_{0.5}$P, X=approximately 0.1 to 0.2) to prevent the light from being absorbed. Subsequently, a SiN$_x$ protective film 110 as an insulator (having a refractive index 1.9 at wavelength 650 nm) was deposited by 200 nm on the surface of the double heteroepitaxial substrate. Many stripe shaped windows 111 were opened in the SiN$_x$ film by photolithography in having a width of 2.2 microns in a [01-1] B direction, which is perpendicular to the off-angle direction. A ridge made of a Zn doped p-type Al$_{0.77}$Ga$_{0.23}$As cladding layer 112 (p=1.5×10$^{18}$ cm$^{-3}$, refractive index 3.3, wavelength 650 nm) having a thickness of 1.2 microns and a Zn doped GaAs contact layer 113 having a thickness of 0.3 micron, was formed by selective growth using MOCVD (FIG. 1(b)). At that time most of the side surfaces of the ridge was frequently (311) A plane or close plane, and the cladding layer of the re-growth portion was grown as to cover the top surface of the protective film serving as an insulator, thereby allowing the contact layer to grow on substantially the entire surface on which a crystal can grow on the cladding layer of the re-growth portion. Therefore, the device can make better the controllability of the optical profile which comes out the vicinity of the protective film and the ridge, can suppress the side surface of the cladding layer from oxidizing, and can reduce the contact resistance with the electrode by increasing the contact area in contact with the electrode on the epitaxial surface side. This tendency is remarkable where the re-growth ridge is AlGaAs, particularly where the Al composition of AlGaAs alloy semiconductor is set 0.2 to 0.9, preferably 0.3 to 0.8. In a general III–V group chemical compound semiconductor, a [01-1]B direction is defined so that the (11-1) plane located between the (100) plane and the (01-1) plane is a plane where the V group element appears.

In the above MOCVD, trimethyl gallium (TMG), trimethyl aluminum (TMA), and trimethyl indium (TMI) were used for source materials for III group source, and arsine and phosphine were used for source materials for V group, and hydrogen was used for carrier gas. Dimethyl zinc was used for the p-type dopant, and disilane was used for the n-type dopant. Moreover, when the ridge is grown, the HCl gas is introduced at a molecular ratio of HCl/group III of 0.2, particularly, 0.3 as a molecular ratio of HCl/TMA.

Figure 1C:
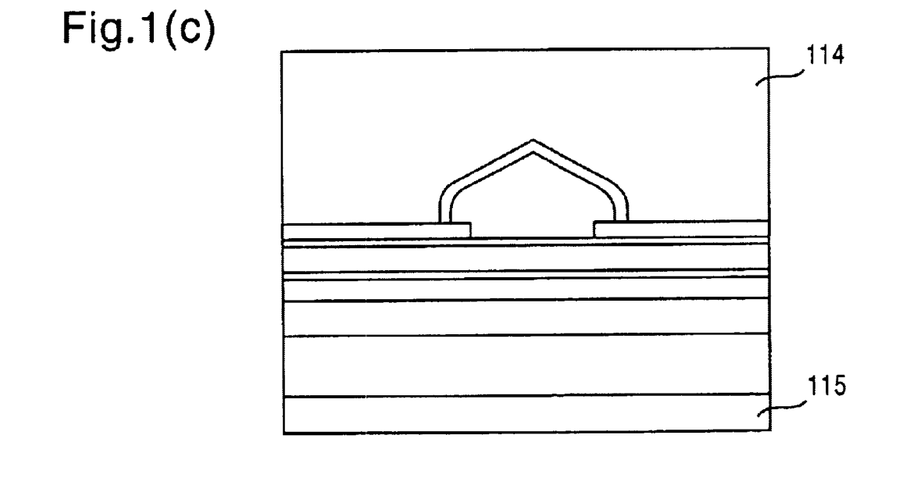

Subsequently, a p-type electrode 114 is evaporated on the side of the epitaxial surface. After the substrate 101 is made thinner to 100 microns, an n-type electrode 115 is evaporated on the substrate and is alloyed (FIG. 1(c)). A laser resonator structure was formed by cutting chips by cleavage from the wafer thus produced. The characteristics of the laser chip thus produced turned out that the laser oscillated at around a wavelength of 650 nm when the distribution was measured in the batch or among the batches, that the characteristics of the threshold current and slope effectiveness are uniform, and that very high reliability can be obtained. In addition, no kink was observed until at least a high output of about 50 mW, and it turned out that the laser could oscillate with a stable transverse mode.

What is claimed is:

1. A semiconductor light-emitting device comprising a substrate having a surface having an off-angle of 0.5° to 30° to a crystallographic plane of (100) or (111), the substrate having thereon:
   compound semiconductor layers including an active layer, formed on said surface having said off-angle;
   a selective growth protective film formed on the compound semiconductor layers and having an opening at the region corresponding to a stripe region to which a current is injected;
   a ridge-shaped compound semiconductor layer formed to cover the opening; and
   a compound semiconductor contact layer formed to cover the entire surface of a top portion and side surfaces of the ridge-shaped compound semiconductor layer.

2. A semiconductor light-emitting device comprising a substrate having a surface having an off-angle of 0.5° to 30° to a crystallographic plane of (100) or (111), the substrate having thereon:
   compound semiconductor layers including an active layer, formed on said surface having said off-angle;
   a protective film formed on the compound semiconductor layers and having an opening at the region corresponding to a stripe region to which a current is injected;
   a ridge-shaped compound semiconductor layer formed to cover the opening, wherein a side wall of the ridge-shaped compound semiconductor layer has a forward mesa shape; and
   a compound semiconductor contact layer formed to cover the entire surface of a top portion and side surfaces of the ridge-shaped compound semiconductor layer.

3. The semiconductor light-emitting device according to claim 1 or claim 2, wherein the compound semiconductor layers including an active layer further include a first conductivity type cladding layer and a second conductivity type first cladding layer.

4. The semiconductor light-emitting device according to claim 1 or claim 2, wherein the ridge-shaped compound semiconductor layer includes a second conductivity type second cladding layer.

5. The semiconductor light-emitting device according to claim 1 or claim 2, wherein no protective film is formed either on a top portion or side surfaces of the ridge-shaped compound semiconductor layer.

6. The semiconductor light-emitting device according to claim 1 or claim 2, wherein the substrate has a surface having an off-angle to a crystallographic plane of (100).

7. The semiconductor light-emitting device according to claim 1 or claim 2, wherein the off-angle is 30 degrees or less.

8. The semiconductor light-emitting device according to claim 1 or claim 2, wherein a direction of the off-angle is a direction at an angle of −30 to 30° from a direction perpendicular to a longitudinal direction of the stripe region.

9. The semiconductor light-emitting device according to claim 8, wherein a longitudinal direction of the stripe region is a direction at an angle of −30 to 30°, and the off-angle direction is a direction at an angle of −30 to 30° from a [0-11] direction.

10. The semiconductor light-emitting device according to claim 1 or claim 2, wherein the active layer is an AlGaInP layer or a GaInP layer and the device has an emission wavelength of 630 nm to 690 nm.

11. A semiconductor light-emitting device comprising
a substrate;
compound semiconductor layers including an active layer formed on the substrate;
selective growth protective film formed on the compound semiconductor layers and having an opening at the region corresponding to a stripe region to which a current is injected; and
a ridge-shaped compound semiconductor layer formed to cover the opening wherein the ridge is horizontally asymmetric.

12. A semiconductor light-emitting device comprising
a substrate;
compound semiconductor layers including an active layer formed on the substrate;
a protective film formed on the compound semiconductor layers and having an opening at the region corresponding to a s tripe region to which a current is injected; and
a ridge-shaped compound semiconductor layer formed to cover the opening wherein a side wall of the ridge-shaped compound semiconductor layer has a forward mesa shape and the ridge is horizontally asymmetric.

13. The semiconductor light-emitting device according to claim 11 or claim 12, which further comprising a contact layer formed to cover the entire surface of a top portion and side surfaces of the ridge-shaped compound semiconductor layer.

14. The semiconductor light-emitting device according to claim 11 or claim 12, wherein the ridge-shaped compound semiconductor layer covers a portion of a top surface of the protective film.

15. The semiconductor light-emitting device according to claim 11 or claim 12, wherein the substrate has an off-angle and the direction of the off-angle is a direction at an angle of −30° to 30° from the direction perpendicular to a longitudinal direction of the stripe region.

16. A semiconductor light-emitting device comprising a substrate having a surface having an off-angle of 0.5° to 30° to a crystallographic plane of (100) or (111), the substrate having thereon:
   compound semiconductor layers including an active layer, formed on said surface having said off-angle;
   a selective growth protective film formed on the compound semiconductor layers and having an opening at the region corresponding to a stripe region to which a current is injected; and
   a ridge-shaped compound semiconductor layer formed to cover the opening and a portion of a top surface of the protective film.

17. A semiconductor light-emitting device comprising a substrate having a surface having an off-angle of 0.5° to 30° to a crystallographic plane of (100) or (111), the substrate having thereon:
   compound semiconductor layers including an active layer, formed on said surface having said off-angle;
   a protective film formed on the compound semiconductor layers and having an opening at the region corresponding to a stripe region to which a current is injected; and
   a ridge-shaped compound semiconductor layer formed to cover the opening and a portion of a top surface of the protective film, wherein a side wall of the ridge-shaped compound semiconductor layer has a forward mesa shape.

18. The semiconductor light-emitting device according to claim 16 or claim 17, wherein the compound semiconductor layers including an active layer further include a first conductivity type cladding layer and a second conductivity type first cladding layer.

19. The semiconductor light-emitting device according to claim 16 or claim 17, wherein the ridge-shaped compound semiconductor layer includes a second conductivity type second cladding layer.

20. The semiconductor light-emitting device according to claim 16 or claim 17, wherein no protective film is formed either on a top portion or side surfaces of the ridge-shaped compound semiconductor layer.

21. The semiconductor light-emitting device according to claim 16 or claim 17, which further comprising a contact layer formed to cover the entire surface of a top portion and side surfaces of the ridge-shaped compound semiconductor layer.

22. The semiconductor light-emitting device according to claim 16 or claim 17, wherein the substrate has a surface having an off-angle to a crystallographic plane of (100).

23. The semiconductor light-emitting device according to claim 16 or claim 17, wherein the off-angle is 30 degree or less.

24. The semiconductor light-emitting device according to claim 16 or claim 17, wherein a direction of the off-angle is a direction at an angle of $-30°$ to $30°$ from a direction perpendicular to a longitudinal direction of the stripe region.

25. The semiconductor light-emitting device according to claim 16 or claim 17, wherein a longitudinal direction of the stripe region is a direction at an angle of $-30°$ to $30°$, and the off-angle direction is a direction at an angle of $-30°$ to $30°$ from a [0-11] direction.

* * * * *